Dec. 3, 1968 M. J. GAY 3,414,829

PUSH-PULL AMPLIFIERS WITH SIGNAL DEPENDENT CLASS A OR B OPERATION

Filed March 23, 1965 2 Sheets-Sheet 1

Dec. 3, 1968 M. J. GAY 3,414,829
PUSH-PULL AMPLIFIERS WITH SIGNAL DEPENDENT
CLASS A OR B OPERATION
Filed March 23, 1965 2 Sheets-Sheet 2

United States Patent Office 3,414,829
Patented Dec. 3, 1968

3,414,829

PUSH-PULL AMPLIFIERS WITH SIGNAL DEPENDENT CLASS A OR B OPERATION

Michael J. Gay, Northampton, England, assignor to Plessey-UK Limited, Ilford, England, a British company Filed Mar. 23, 1965, Ser. No. 442,067
Claims priority, application Great Britain, Mar. 26, 1964, 12,972/64
5 Claims. (Cl. 330—15)

ABSTRACT OF THE DISCLOSURE

An amplifier arrangement capable of feeding a centre tapped load in class A push-pull for relatively small input signals and in class B push-pull for larger input signals and comprising two similar amplifying sections each having a gain defined by negative feed back which is automatically modified as the amplifier changes from one class of operation to the other such that the gain is maintained substantially constant for both classes of operation.

The invention relates to push-pull amplifier arrangements.

According to one feature of the invention we provide a push-pull amplifier arrangement capable of operating in a class A or class B mode comprising two similar amplifying sections arranged to feed their outputs into opposite halves of a centre-tapped load, the arrangement being such that when antiphase signals of similar amplitude are respectively applied to the sections, in the class A operating region both sections act as substantially linear class A amplifiers, having a gain defined by negative feedback applied over each section, and in the class B operating region the negative feedback factor is reduced, preferably halved, such that the overall amplifier gain is maintained at a substantially constant level.

It should be understood that in the class B operating region the two sections drive the load alternately, feeding signals into opposite halves; thus only one half of the load is driven at any time during the class B operating periods. This would reduce the overall amplifier gain to half that obtaining during the class A operating periods, when both halves of the load are driven simultaneously.

The circuit arrangement preferably utilises semiconductor devices as amplifying devices in each of said sections. The whole arrangement may be formed as a solid state circuit conveniently on a single chip of semiconductor material.

Further features of the invention will become apparent from the following description of two preferred embodiments thereof with reference to the accompanying drawings, in which.

Figure 1:
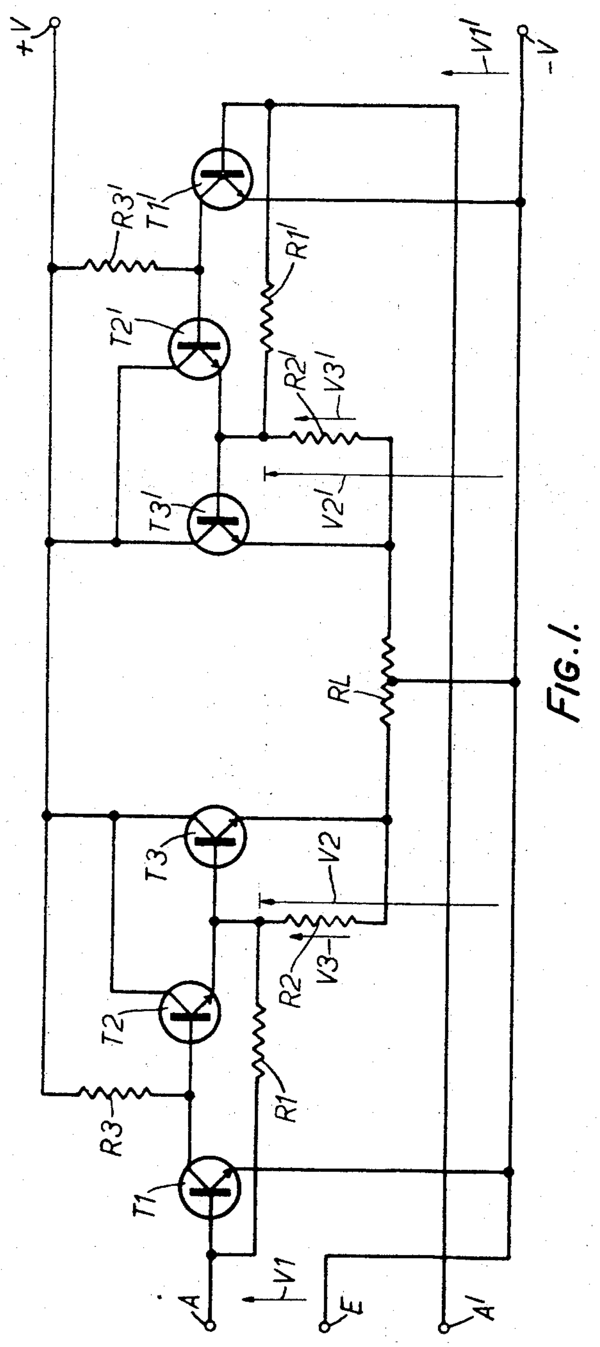
FIGURE 1 shows a circuit arrangement for a push-pull amplifier.

Referring now to FIGURE 1 there is shown a circuit arrangement for a push-pull amplifier capable of operating in a class A or class B mode.

The circuit arrangement has three input terminals referenced A, E, and A′ and two power supply terminals reference +V and −V.

Input terminal A is connected to the base electrode of a transistor $T_1$ and via a resistor $R_1$ to the base electrode of a further transistor $T_3$. The collector electrode of transistor $T_1$ is connected via a resistor $R_3$ to terminal +V and is connected to the base electrode of transistor $T_2$, the emitter electrode of transistor $T_1$ being connected to the terminal −V. The collector electrode of transistors $T_2$ and $T_3$ are commoned and connected to terminal +V.

The emitter electrode of transistor $T_2$ is connected to the base electrode of transistor $T_3$ and is connected via a resistor $R_2$ to one side of a load resistor RL, the load resistor $R_L$ having a centre tap which is connected to the terminal −V. The emitter electrode of transistor $T_3$ is also connected to the end of the load resistor RL which is connected to the resistor $R_2$.

The circuit described thus far represents one amplifying section of the whole circuit arrangement. A further similar amplifying section is connected between the input terminal A′ and the other side of the load resistor RL, the components of this further section having like references as the components of the fully described section but being indicated by a dash.

The transistors $T_3$, $T_3'$, $T_1$ and $T_1'$ should have similar base-emitter voltages for conduction at low levels.

In operation equal antiphase input signals are fed from a current source via input terminals A and A′ respectively, input terminal E being common, to the two amplifying sections.

Under quiescent conditions transistors $T_1$, $T_1'$, $T_2$ and $T_2'$ are in conduction, while transistors $T_3$, $T_3'$ are non-conducting. The quiescent potentials $V_1$ and $V_1'$ are the base-emitter voltages of transistors $T_1$ and $T_1'$, while the potentials $V_2$ and $V_2'$ are slightly above these values, due to the base currents of transistors $T_1$ and $T_1'$ flowing through the resistors $R_1$ and $R_1'$ respectively. The resistors $R_2$ and $R_2'$ are each nominally equal to the half the load $(RL/2)$, though small variations may be made to optimise the circuit performance. The quiescent potentials $V_3$ and $V_3'$ are thus approximately half of $V_2$ and $V_2'$ respectively. Provided the resistors $R_1$ and $R_1'$ are not too large these potentials ($V_3$ and $V_3'$) will be approximately half of $V_1$ and $V_1'$ respectively the transistors $T_3$ and $T_3'$ will thus be biased with a base-emitter voltage of approximately half that required for conduction. The potentials $V_2$ and $V_2'$ are provided by currents flowing through transistors $T_2$ and $T_2'$ respectively. In the class A operating region transistors $T_3$ and $T_3'$ remain out of conduction, transistors $T_2$ and $T_2'$ acting as the output transistors. Shunt negative feedback is applied via the resistors $R_1$ and $R_1'$, the feedback factor being defined as the fraction of the output current fed back for each half of the amplifier as follows:

$$\beta_A = \frac{R_2 + \frac{R_L}{2}}{R_1 + R_2 + \frac{R_L}{2}}$$

Substituting $$R_2 = \frac{R_L}{2}$$

and $$R_1 \gg R_2$$

$$\beta_A \simeq \frac{R_L}{R_1}$$

The change to class B operation occurs when the peak alternating currents flowing in transistors $T_2$ and $T_2'$ equal the quiescent currents. Under these conditions the instantaneous currents in transistors $T_2$ and $T_2'$ will be varying in antiphase between zero and twice the quiescent value. At higher input signal levels transistors $T_2$ and $T_2'$ will each be cut off for part of each cycle, and will each pass currents in excess of twice the quiescent current for part of each cycle. Whilst transistor $T_2$ or $T_2'$ is cut off no current flows from the corresponding section of the amplifier into the load. When the current passed by one of these transistors exceeds twice the quiescent value, the voltage developed across the corresponding resistors $R_2$ or $R_2'$ exceeds that necessary to turn on transistor $T_3$ or $T_3'$, and can then rise very little further. The output current is then supplied predominantly by transistor $T_3$ or $T_3'$.

At high signal levels the circuit thus operates in class B mode using transistors $T_3$ and $T_3'$ as output transistors. Negative feedback is applied over the operating section during the class B operating period via resistors $R_1$ and $R_1'$ as before, but, as the voltage across resistors $R_2$ or $R_2'$ remains virtually constant, the feedback factor becomes $$\beta_B \simeq \frac{R_L}{2R_1}$$

which is half the value obtaining during class A operation, as is required.

Figure 2:
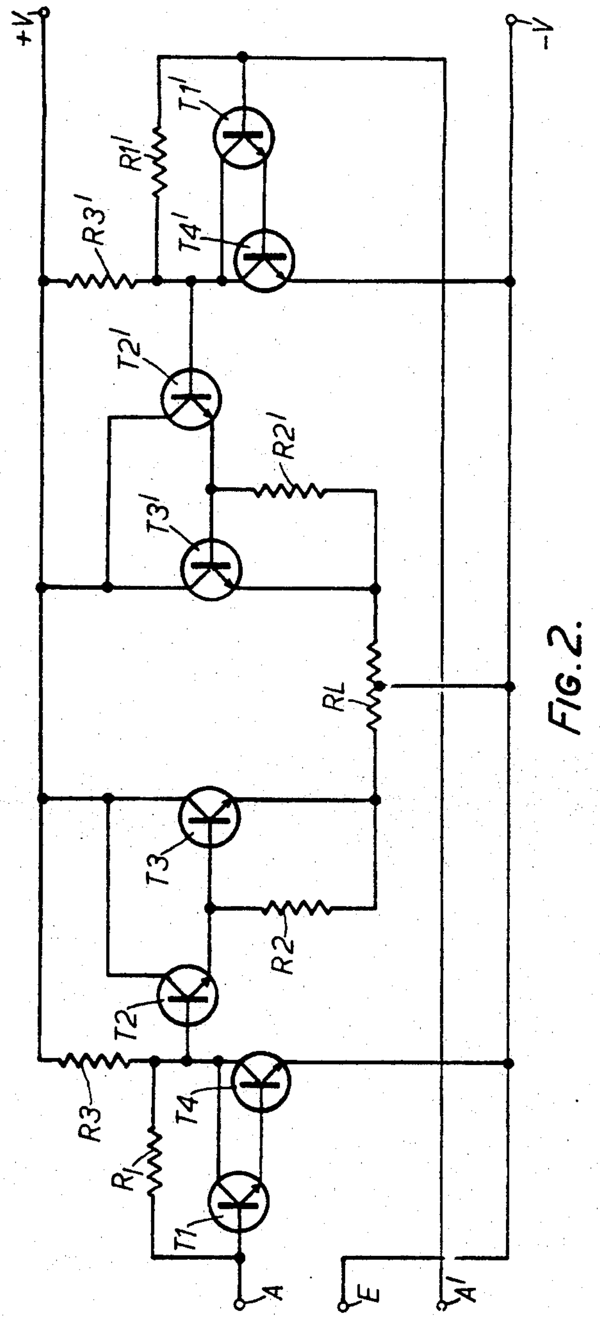
FIGURE 2 shows a circuit arrangement similar to that of FIGURE 1 but including some minor modifications.

Referring now to FIGURE 2 there is shown a push-pull amplifier circuit, having two sections, which is similar to the circuit of FIGURE 1 but includes some minor modifications.

In FIGURE 2 resistors $R_1$ and $R_1'$ are connected between the input terminals A and A' respectively and the side of resistors $R_3$ and $R_3'$ respectively which are remote from the terminal $\neq$V. A further transistor $T_4$ and $T_4'$ has been aded to each section of the amplifier, these transistors being connected respectively with transistors $T_1$ and $T_1'$ so as to form so-called "Darlington pairs." The operation of the circuit shown in FIGURE 2 is substantially the same as that described for FIGURE 1 but with the circuit of FIGURE 2 better definition of quiescent conditions is obtained at higher gain values.

Both the circuits described and illustrated in FIGURES 1 and 2 have been designed so as to be suitable for fabrication in solid state form. It should be appreciated that in circuits fabricated in solid state form the necessity to minimise the number of semiconductor components present can be disregarded as the cost of components is very small, either of the circuit arrangements shown being capable of accommodation on a semiconductor chip of about 70 to 150 thousandths of an inch in length.

It should be noted that the two sections of the amplifier act as linear class A amplifiers under small signal conditions. This results in a considerable reduction in the distortion occurring under these conditions.

The difficulties normally ecountered in the definition of the quiescent conditions are removed. In particular the quiescent conditions are substantially independent of the supply voltage.

No large capacitors are required. This allows a good low frequency response to be more easily achieved and by avoiding the use of such large capacitors a very reliable circuit can be fabricated.

The following table shows typical component values for the circuits of FIGURES 1 and 2.

| Resistors: | Ohms |
|---|---|
| $R_1$ and $R_1'$ | 5K |
| $R_2$ and $R_2'$ | 40 |
| $R_3$ and $R_3'$ | 7.5K |
| RL | [1] 80 |

[1] +9 volts being supplied to terminal +V.

For FIGURE 2 the values of resistors $R_1$ and $R_1'$ are changed to 20K ohms the values of all other components remaining the same.

The circuits hereinbefore described are particularly suitable for use as the power output stage of, for example, a record player or transistor radio, the load resistance RL representing the resistance of a loudspeaker.

What I claim is:

1. An amplifier capable of operating automatically in class A or class B for relatively small or relatively large input signal levels respectively comprising two similar amplifying sections, a load component opposing ends of which are fed in push-pull by respective amplifier sections, each section including a first transistor the emitter of which is connected to the load component, a second transistor the emitter of which is connected directly to the base of the first transistor, a resistor via which the emitter of the second transistor is connected to the load component, a first voltage supply rail to which the collectors of said first and second transistors respectively are connected, a second voltage supply rail of opposite polarity to the first voltage supply rail and to which a centre tap of said load is connected, and a transistor input amplifier stage which includes a feed-back component operatively associated with said second transistor, the relative impedance of said load, said components and said resistors being such that for relatively small input signal levels the second transistor drives the load in class A operation and for other larger input signal levels the load is driven in class B by the first transistor, overall amplifier gain being substantially the same for both classes of operation.

2. An amplifier as claimed in claim 1, wherein each transistor input amplifier stage comprises a single transistor the collector of which is connected to the base of the second transistor and a load resistor connected between the first voltage supply rail and the collector of said single transistor, the base of the single transistor constituting an input signal terminal and being coupled via the feed-back component to the emitter of said second transistor.

3. An amplifier as claimed in claim 1, wherein each transistor input amplifier comprises a Darlington transistor pair, a load resistor connected between the first supply rail and the collectors of said pair, the base of the second transistor being connected to the said collectors and coupled by the feed-back component to the base of the input transistor of the said Darlington transistor pair.

4. An amplifier as claimed in claim 1 wherein the feed-back component is a resistor.

5. An amplifier as claimed in claim 1 wherein the said amplifier is fabricated as an integrated circuit structure.

References Cited

UNITED STATES PATENTS

| | | | |
|---|---|---|---|
| 2,910,689 | 10/1959 | Grace | 330—15 XR |
| 3,002,802 | 10/1961 | Rich | 330—15 XR |
| 3,042,875 | 7/1962 | Higginbotham | 330—30 XR |
| 3,225,209 | 12/1965 | Schuster | 330—15 XR |
| 3,239,770 | 3/1966 | Taber | 330—15 |
| 3,292,094 | 12/1966 | Jones | 330—15 |

ROY LAKE, *Primary Examiner.*

S. H. GRIMM, *Assistant Examiner.*